(12) United States Patent
Li et al.

(10) Patent No.: US 11,942,505 B2
(45) Date of Patent: Mar. 26, 2024

(54) PIXEL STRUCTURE OF STACKED IMAGE SENSOR AND PREPARATION METHOD THEREOF

(71) Applicants: SHANGHAI IC R&D CENTER CO., LTD., Shanghai (CN); CHENGDU IMAGE DESIGN TECHNOLOGY CO. LTD., Chengdu (CN)

(72) Inventors: Chen Li, Shanghai (CN); Jiebin Duan, Shanghai (CN)

(73) Assignees: SHANGHAI IC R&D CENTER CO., LTD., Shanghai (CN); CHENGDU IMAGE DESIGN TECHNOLOGY CO. LTD., Chengdu (CN)

( * ) Notice: Subject to any disclaimer, the term of this patent is extended or adjusted under 35 U.S.C. 154(b) by 433 days.

(21) Appl. No.: 17/280,812

(22) PCT Filed: Aug. 7, 2019

(86) PCT No.: PCT/CN2019/099582
§ 371 (c)(1),
(2) Date: Mar. 26, 2021

(87) PCT Pub. No.: WO2020/063121
PCT Pub. Date: Apr. 2, 2020

(65) Prior Publication Data
US 2021/0408100 A1    Dec. 30, 2021

(30) Foreign Application Priority Data
Sep. 26, 2018  (CN) .......................... 201811123344.6

(51) Int. Cl.
*H01L 27/146* (2006.01)
(52) U.S. Cl.
CPC ...... *H01L 27/14649* (2013.01); *H01L 27/146* (2013.01); *H01L 27/1463* (2013.01);
(Continued)

(58) Field of Classification Search
CPC .......... H01L 27/14649; H01L 27/1463; H01L 27/14632; H01L 27/14636;
(Continued)

(56) References Cited

U.S. PATENT DOCUMENTS

2016/0254306 A1* 9/2016 Chen ....................... H01L 31/18
257/292
2019/0067365 A1* 2/2019 Itonaga ................ H04N 25/134

OTHER PUBLICATIONS

CN 106298824 (Year: 2017).*

* cited by examiner

*Primary Examiner* — Ahmed N Sefer
(74) *Attorney, Agent, or Firm* — Andrew C. Cheng (57) ABSTRACT

The present invention discloses a pixel structure of a stacked image sensor and a preparation method thereof, by bonding processes to stack a first silicon wafer to a third silicon wafer up and down; wherein, a first photodiode array is set on the first silicon wafer located in middle, and a second photodiode array is provided on the second silicon wafer located above, and the surface of each the second photodiode in the second photodiode array is aligned and bonded correspondingly with the surface of each the first photodiode in the first photodiode array, so as to form a chip of the pixel structure of the stacked image sensor with a very deep junction depth, which is particularly suitable for near-infrared sensitization, and can effectively improve quantum efficiency in near-infrared wave bands; and by adopting a backlight technology, incident lights irradiating to photodiodes are not affected by the metal interconnect layers, both of sensitive and fill factor are high, especially for small-size pixels, which has very good photosensitive performance, so as to balance the near-infrared quantum efficiency and the small pixel size.

10 Claims, 5 Drawing Sheets

(52) U.S. Cl.
CPC .. *H01L 27/14632* (2013.01); *H01L 27/14636* (2013.01); *H01L 27/14643* (2013.01); *H01L 27/14683* (2013.01); *H01L 27/14687* (2013.01)

(58) Field of Classification Search
CPC ............. H01L 27/14687; H01L 27/146; H01L 27/14643; H01L 27/14683
See application file for complete search history.

PIXEL STRUCTURE OF STACKED IMAGE SENSOR AND PREPARATION METHOD THEREOF

CROSS-REFERENCE TO RELATED APPLICATION

This application claims priority of International Patent Application Serial No. PCT/CN2019/099582, filed Aug. 7, 2019, which is related to and claims priority of Chinese patent application Serial No. 201811123344.6, Sep. 26, 2018. The entirety of each of the above-mentioned patent applications is hereby incorporated herein by reference and made a part of this specification.

TECHNICAL FIELD

The disclosure relates to the technical field of image sensor, in particular to a pixel structure of a stacked image sensor and a preparation method thereof.

BACKGROUND

An image sensor is an important part of a digital camera. Depending on components, it can be classified into two types: CCD (Charge Coupled Device) and CMOS (Complementary Metal-Oxide Semiconductor). One of preconditions for the CMOS image sensors to be widely used is higher sensitivity, shorter exposure times and shrinking pixel sizes.

Wherein, pixel sensitivity, which is one of important performance indicators of the CMOS image sensors, is mainly determined by product of a fill factor (a ratio of photosensitive area to entire pixel area) and a quantum efficiency (number of electrons generated by photons bombarded a screen). In the CMOS image sensors, active pixels are applied in the CMOS image sensors in order to achieve noise levels and sensitivity levels comparable to those of CCD converters. However, application of the active pixels (pixel cells) inevitably results in a decrease in the fill factor because a considerable portion of surface area of the pixels is occupied by an amplifier transistor or others, then a relatively small area is available for a photodiode. Therefore, an important research direction of the CMOS image sensors is to expand the fill factor.

Traditional CMOS image sensors adopts a Front Side Illumination (FSI) technology, which is a front-illumination technology. A main feature of the front-illumination technology is sequential fabrications of photodiodes, metal interconnect layers and light pipes on a front surface of a wafer. Advantage is that processes are simple and fully compatible with CMOS processes, cost is low, and refractive index of a light pipe hole filling material is adjustable, which is favorable for improving transmittance of incident lights and reducing crosstalk. The front-illumination technology is a technology compatible with CMOS standard processes and is widely used in productions of various (especially large-pixel) CMOS image sensor chips. However, because lights need to pass through the upper metal interconnect layers to illuminate underlying photodiodes located below firstly, the fill factor and sensitivity of the front-illumination technique are generally low.

As pixel sizes become smaller, increasing the fill factor is becoming more and more difficult. At present, another technology is changing from the traditional front-sensitivity type to a back-sensitivity type (BSI, Back Side Illumination), that is, a back-illumination technology. A main feature of the back-illuminated technology is forming photodiodes and metal interconnect layers firstly in sequence on front surface of a silicon wafer, then thinning the back surface of the silicon wafer (usually need to be thinned to below 20 um), and leading out the photodiodes by a most important technology for the back-sensitive CMOS sensor, which is a Through-silicon-via technology (TSV, Through-Silicon-Via) to realize interconnection, which is a newest technology for realizing interconnection between chips by forming vertical conduction between chips and between silicon wafers. Since interconnection circuits are placed on a back surface, a front surface is left for the photodiodes, thus achieving the fill factor as large as possible. Advantage of the TSV technology is that incident lights irradiated to the photodiodes are not affected by metal interconnect layers, the sensitivity is higher, and the fill factor is higher. However, the TSV technology is difficult, which requires higher levels of equipments and cost is relatively high. Moreover, due to limitations of thinning processes of ultra-thin silicon wafers, the back-illumination technology is usually applied to image sensors with small pixels.

In typical applications such as surveillance and vehicle, dark light scenes are very common. For the dark light scenes, infrared fill lights are usually used to increase the sensitivity and the wavelength range of the infrared fill lights is usually 850-940 nm. Therefore, the image sensors are required to have good near-infrared sensitivity in the wavelength range, that is, quantum efficiency is expected to be greatly improved. For a photodiode, a blue photosensitive junction is shallower, a green photosensitive junction is in middle, a red photosensitive junction is deeper, and a near-infrared photosensitive junction is deeper. Due to influences of pre-processes, it is usually impossible to gain a very deep junction depth, which leads to the sensitivity and the quantum efficiency for near-infrared lights are poor.

SUMMARY

The technical problem to be solved by the present invention is to provide a pixel structure of a stacked image sensor and a preparation method thereof.

In order to achieve the above object, the present invention provides a pixel structure of a stacked image sensor, comprising:
  a first silicon wafer, which comprises:
    a first photodiode array and control transistors located above;
    a metal interconnect layer located below;
  a second silicon wafer, which comprises:
    a second photodiode array;
  the second silicon wafer and the first silicon wafer are stacked up and down and bonded; wherein,
  both of the first silicon wafer and the second silicon wafer are bulk silicon wafers;
  upper surface of each first photodiode in the first photodiode array is exposed and flush with the upper surface of the first silicon wafer, upper and lower surfaces of each the second photodiode in the second photodiode array are exposed and flush respectively with the upper and lower surfaces of the second silicon wafer, the upper surface of each the first photodiode is aligned with and bonded to the lower surface of the second photodiode correspondingly, upper surfaces other than the first photodiodes on the first silicon wafer is aligned with and bonded to lower surfaces other than the second photodiodes on the second silicon wafer correspondingly.

Further, the first photodiode and the second photodiode are bonded to form a third photodiode, and the junction depth of the third photodiode is greater than photosensitive depth of required near-infrared sensitivity.

Further, the sizes of the first photodiode and the second photodiode are 1-9 microns.

Further, a first isolation layer is set around each the first photodiode, and the upper surface of the first isolation layer is flush with the upper surface of the first photodiode, a second isolation layer is set around each the second photodiode, the upper and lower surfaces of the second isolation layer are flush respectively with the upper and lower surfaces of the second photodiode, and the upper surface of the first isolation layer is aligned with and bonded to the lower surface of the second isolation layer correspondingly.

Further, the metal interconnect layer is one to multiple layers.

Further, also comprising TSVs (short for through-silicon via), the TSVs pass through the second silicon wafer which stacked with the first silicon wafer, the upper end of the TSVs are connected to a PAD layer on the upper surface of the second silicon wafer, and the lower end of the TSVs are connected to the control transistors located above on the first silicon wafer.

Further, also comprising a third silicon wafer, the lower surface of the first silicon wafer and the upper surface of the third silicon wafer are stacked up and down and bonded together.

The preparation method for a pixel structure of a stacked image sensor, comprising:

providing a first silicon wafer, forming a first photodiode array on the front surface of the first silicon wafer, and forming a first isolation layer around and at the bottom of each the first photodiode in the first photodiode array, forming control transistors and a metal interconnect layer above the front surfaces of the first photodiode array and the control transistors;

providing a second silicon wafer, forming a second photodiode array on the front surface of the second silicon wafer, and forming a second isolation layer around and at the bottom of each the second photodiode in the second photodiode array;

flipping the first silicon wafer, and aligning the front surface of the first silicon wafer with a front surface of a third silicon wafer and then performing a bonding process;

thinning the back surface of the first silicon wafer until the first isolation layer at the bottom of the first photodiode is removed completely, so as to expose the bottom of the first photodiode completely;

aligning the front surface of the second silicon wafer with the back surface of the first silicon wafer and then performing a bonding process;

thinning the back surface of the first silicon wafer until the first isolation layer at the bottom of the first photodiode is removed completely, so as to expose the bottom of the first photodiodes completely;

aligning the front surface of the second silicon wafer with the back surface of the first silicon wafer and then performing a bonding process;

thinning the back surface of the second silicon wafer until the second isolation layer at the bottom of the second photodiode is removed completely, so as to expose the bottom of the second photodiodes completely;

forming and filling TSVs in both the second silicon wafer and the first silicon wafer, connecting the lower ends of the TSVs with the control transistors on the first silicon wafer, and exposing the upper ends of the TSVs on the back surface of the second silicon wafer;

forming a PAD layer on the back surface of the second silicon wafer, connecting the PAD layer with the upper ends of the TSVs.

Further, aligning the front surface of the second silicon wafer with the back surface of the first silicon wafer and then performing a bonding process, comprising: the surfaces of the second photodiodes on the front surface of the second silicon wafer are aligned with the surfaces of the first photodiodes exposed on the back surface of the first silicon wafer, and the surface of the second isolation layer exposed on the front surface of the second silicon wafer is aligned with the surface of the first isolation layer exposed on the back surface of the first silicon wafer, and then bonding together.

Further, the bonding processes is performed by a TSV method or a hybrid bonding method.

Beneficial effects of the present invention are that, by forming a pixel structure of a stacked image sensor with a very deep junction depth, which is particularly suitable for near-infrared sensitization, and can effectively improve quantum efficiency in near-infrared wave bands; and by adopting a backlight technology, incident lights irradiating to photodiodes are not affected by the metal interconnect layers, both of sensitive and fill factor are high, especially for small-size pixels, which has very good photosensitive performance, so as to balance the near-infrared quantum efficiency and the small pixel size.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

It is to be understood that "first", "second" and similar terms used in the specification and claims are not to represent any sequence, number or importance but only to distinguish different parts. Likewise, similar terms such as "a" or "an" also do not represent a number limit but represent "at least one". It is also to be understood that term "and/or" used in the present disclosure refers to and includes one or any or all possible combinations of multiple associated items that are listed.

Figure 1:
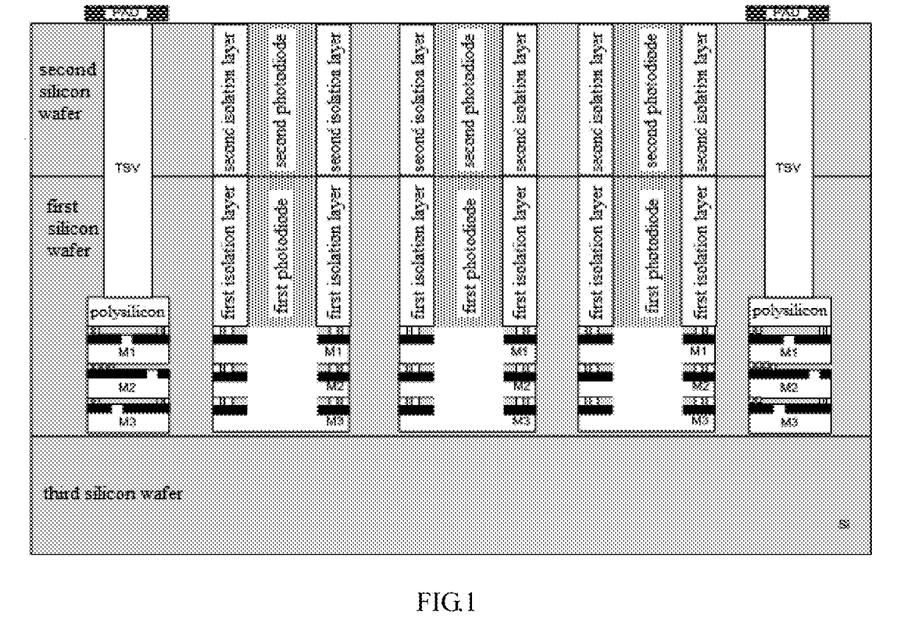
FIG. 1 is a schematic diagram of a pixel structure of a stacked image sensor according to a preferred embodiment of the present invention.

As shown in FIG. 1, a pixel structure of a stacked image sensor of the present invention is set on a first silicon wafer, a second silicon wafer, and a third silicon wafer (Si) stacked up and down and bonded together. Wherein, the second silicon wafer is located above, the first silicon wafer is located in middle, and the third silicon wafer is located below, so as to form a three-layer wafer structure stacked up and down and bonded together. The first silicon wafer to the third silicon wafer can be formed by a bulk silicon wafer.

Please refer to FIG. 1. A first photodiode array and control transistors are set on the first silicon wafer. The first photodiode array is composed of a plurality of first photodiodes arranged regularly. A first isolation layer is set around each the first photodiode; that is, each the first photodiode is surrounded by a first isolation layer. Any two adjacent the first isolation layers can be arranged separately.

The first isolation layer can be formed by materials such as an oxide layer, SiN and so on.

The first photodiode is set around by the control transistors, which are a polysilicon (POLY) gate structure of the control transistors located surrounding the first photodiode as shown in FIG. 1. The first photodiode array and the control transistors are located above on the first silicon wafer; a metal interconnect layer located below is provided on the first silicon wafer, which is below the first photodiode array and the control transistors.

The metal interconnect layer can be set in one to multiple layers. For example, the metal interconnect layer illustrated comprises a three-layer structure of the metal interconnect layers M1, M2, M3 set in a dielectric layer. The metal interconnect layers M1, M2, M3 can be formed by interconnecting metals such as copper.

Surrounding circuits are mainly used for IO, signal extraction and circuits with higher noise. Wherein, the polysilicon (POLY) and the metal interconnection layers M1, M2, M3 are interconnected with the first photodiodes, which are subsequent used for electrical signal extraction of the first photodiodes and connection of a control signal.

The size (width) of the first photodiodes can be 1.0~9.0 microns, preferably 2.0 microns.

Please refer to FIG. 1. a second photodiode array is set on the second silicon wafer. The second photodiode array is composed of a plurality of second photodiodes arranged regularly, and number, size, position, etc. of the second photodiodes are correspondingly to the first photodiodes.

The size (width) of the second photodiode can be 1.0~9.0 microns, preferably 2.0 microns.

The first photodiodes and the second photodiodes can be a cubic shape.

A second isolation layer is set around each the second photodiode; that is, each the second photodiode is surrounded by the second isolation layer. Any two adjacent the second isolation layers can be arranged separately.

The second isolation layer can be formed by materials such as an oxide layer, SiN and so on.

Please refer to FIG. 1. The second silicon wafer and the first silicon wafer are stacked up and down and bonded together. Wherein, The upper surface of each the first photodiode in the first photodiode array is exposed and flush with the upper surface of the first silicon wafer. The upper surface of each the second photodiode in the second photodiode array is exposed and flush with the upper surface of the second silicon wafer; the lower surface of each the second photodiode is exposed and flush with the lower surface of the second silicon wafer. The upper surface of each the first photodiode is aligned with and bonded to the lower surface of the correspondingly second photodiode. Simultaneously, The upper surface of the first isolation layer is flush with the upper surface of the first photodiode, that is, the upper surface of the first isolation layer is flush with the upper surface of the first silicon wafer; the upper surface of the second isolation layer is flush with the second photosensitive, and the lower surface of the second isolation layer is flush with the lower surface of the second photodiode, that is, the upper and lower surfaces of the second isolation layer are respectively flush with the upper and lower surfaces of the second silicon wafer. The upper surface of the first isolation layer around each the first photodiode is aligned with and bonded to the correspondingly lower surface of the second isolation layer around each the second photodiode. Simultaneously, The upper surface of the silicon layer of the first silicon wafer other than the surfaces occupied by the first photodiodes and the first isolation layer on the first silicon wafer are aligned with and bonded to the correspondingly lower surface of the silicon layer of the second silicon wafer other than the surfaces occupied by the second photodiodes and the second isolation layer on the second silicon wafer.

Please refer to FIG. 1. The first photodiodes and the second photodiodes are bonded to form third photodiodes, that is, the third photodiodes are formed by bonding the second photodiodes and the first photodiodes up and down, which makes sizes of photodiodes of the pixel structure of the stacked image sensor of the present invention increase exponentially, so as to form the junction depths of the third photodiodes are greater than that photosensitive depth of required near-infrared sensitivity.

TSVs are also set in the second silicon wafer and the first silicon wafer. The TSVs pass from the upper surface of the second silicon wafer through the second silicon wafer into the first silicon wafer and contact the polysilicon (POLY) of the control transistors on the first silicon wafer. Meanwhile, a PAD layer is set on the upper surface of the second silicon wafer, the upper ends of the TSVs are connected to the PAD layer, and the lower ends are connected to the polysilicon (POLY) of the control transistors. TSVs are used to lead out a chip signal of the stacked image sensor from the PAD layer to off-chip by vertically metal interconnection.

Please refer to FIG. 1. The third silicon wafer is arranged below the first silicon wafer; the lower surface of the first silicon wafer and the upper surface of the third silicon wafer are stacked up and down and bonded together. Wherein, an oxide layer and a metal interconnect layer can also be provided on the upper surface of the third silicon wafer, when bonding with the first silicon wafer, both of the oxide layers are aligned and bonded, and both of the metal interconnection layers are aligned and bonded, so as to bond the lower surface of the first silicon wafer with the upper surface of the third silicon wafer.

The following describes in detail a preparation method for a pixel structure of a stacked image sensor according to the present invention through specific embodiments and accompanying drawings.

Figure 2:
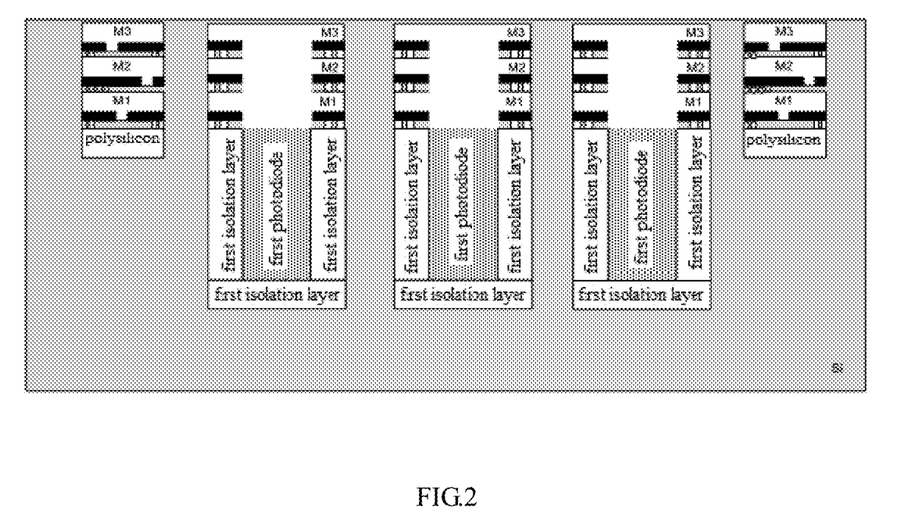
FIG. 2-8 are schematic diagrams of process steps of a preparation method for a pixel structure of a stacked image sensor according to a preferred embodiment of the present invention.

Please refer to FIG. 2-8. The preparation method for a pixel structure of a stacked image sensor of the present invention can be used to preparing the pixel structure of the stacked image sensor described above, and comprises following steps:

Please refer to FIG. 2. Step S01: providing a first silicon wafer, for example, a bulk silicon wafer (wafer), performing a CMOS standard process to form a first photodiode array on the front side of the first silicon wafer (corresponding to the direction of the lower surface of the first silicon wafer in FIG. 1, same applies below); and a first isolation layer is formed around and on the bottom of each the first photodiode in the first photodiode array, which wraps the first photodiodes completely from sides and bottom. A control transistor is formed correspondingly around the first photodiode, which including a polysilicon (POLY) gate structure to form the control transistor. Metal interconnect layers M1~M3 are formed on the front surfaces of the first photodiode array and the control transistor.

Figure 3:
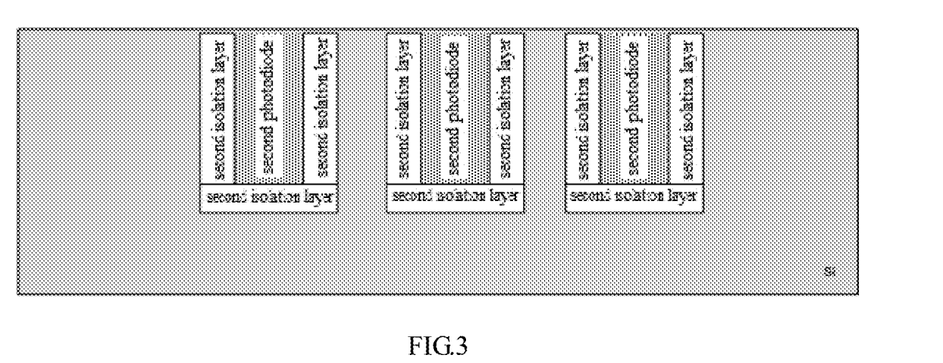

Please refer to FIG. 3. Step S02: providing a second silicon wafer, performing a CMOS standard process to form a second photodiode array on the front surface of the second silicon wafer (corresponding to the direction of the lower surface of the second silicon wafer in FIG. 1, same applies below); and a second isolation layer is formed around and on the bottom of each the second photodiode in the second photodiode array, which wraps the second photodiode completely from sides and bottom.

Figure 4:
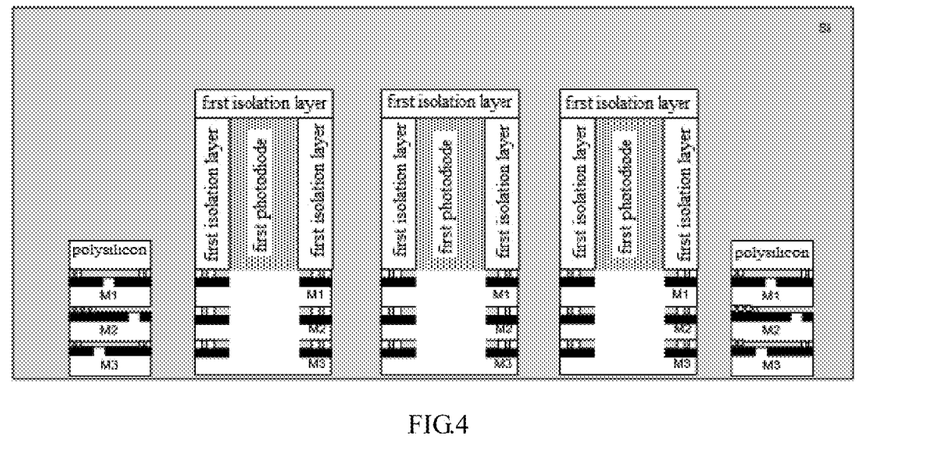

Please refer to FIG. 4. Step S03: flipping (turning down) the first silicon wafer to turn the front side of the first silicon wafer face down, that is, the first photodiode array and the poly-silicon of the control transistor on the first silicon wafer are located above and the metal interconnect layers M1~M3 are located below.

Figure 5:
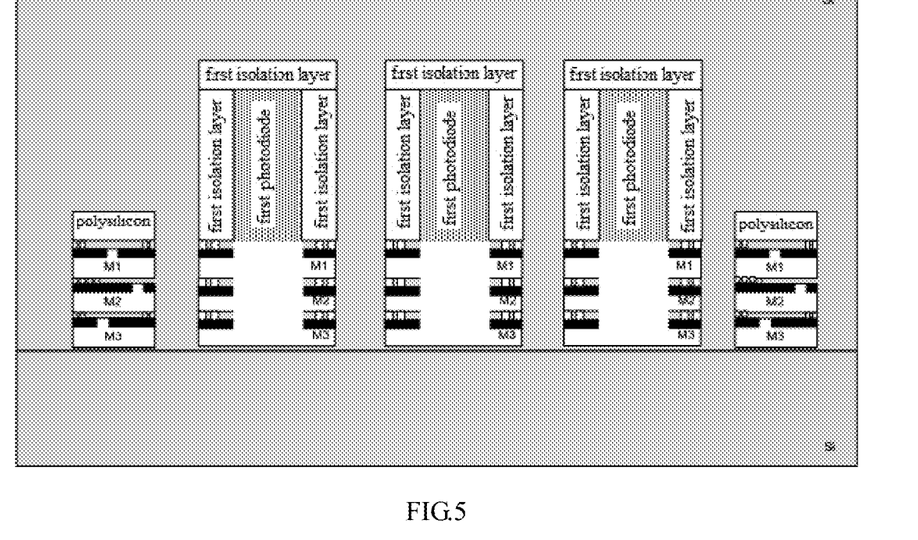

Please refer to FIG. 5. Step S04: aligning the front surface of the first silicon wafer with the front surface of the third silicon wafer (corresponding to the direction of the upper surface of the third silicon wafer in FIG. 1, same applies below) and performing a bonding process. The bonding process comprises aligning and bonding the surface of the oxide layer (or SiN) exposed on the front surface of the first silicon wafer with the surface of the oxide layer (or SiN) exposed on the front surface of the third silicon wafer, aligning and bonding the surface of the connecting layer M3 with the surface of the metal interconnect layer (not shown) exposed on the front surface of the third silicon wafer, and aligning and bonding other surface exposed of the bulk silicon wafer on the front surface of the first silicon wafer with other surface exposed of the bulk silicon wafer on the front surface of the third silicon wafer.

The bonding process between the first silicon wafer and the third silicon wafer can be performed by a through-silicon vias (TSV) bonding or a hybrid bonding (hybrid-bonding).

Figure 6:
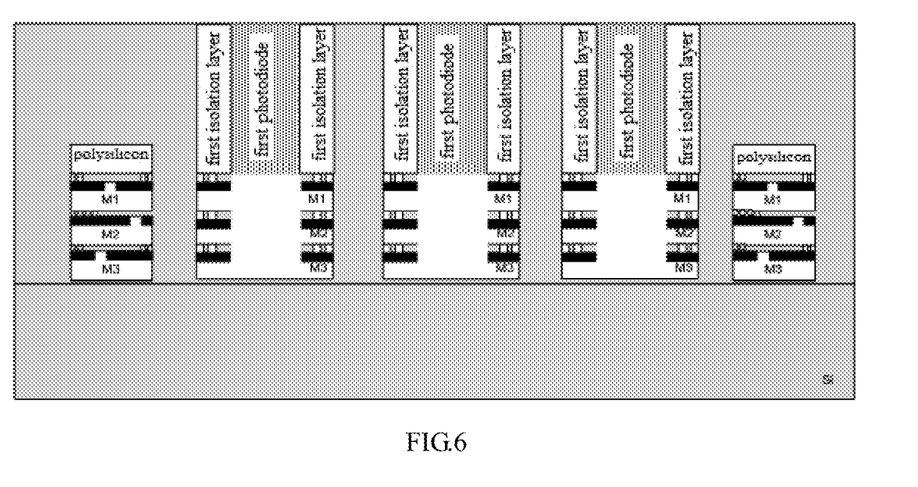

Please refer to FIG. 6. Step S05: performing a thinning process on the bonded silicon wafer, that is, performing the thinning process on the back surface of the first silicon wafer (corresponding to the direction of the upper surface of the first silicon wafer in FIG. 1, same applied below), for example, performing a CMP process, polishing to a depth to reach the first photodiodes and removing the first isolation layer at the bottoms of the first photodiodes (the upper side in FIG. 6) completely, so as to expose the bottoms of the first photodiodes completely.

Figure 7:
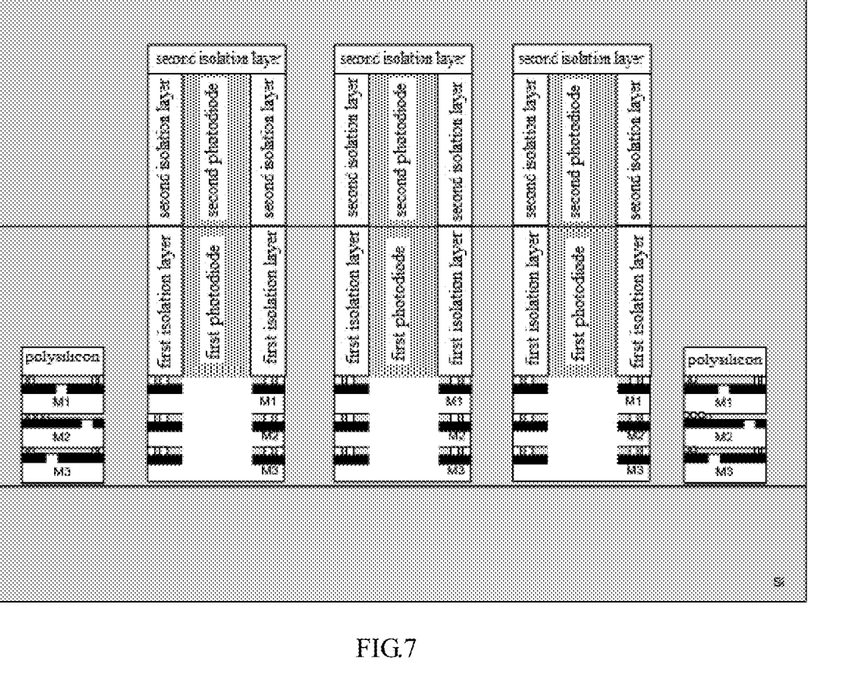

Please refer to FIG. 7. Step S06: aligning the front surface of the second silicon wafer with the back surface of the first silicon wafer and then performing a bonding process.

The bonding process comprises aligning and bonding the surface of the oxide layer (or SiN) exposed on the front surface of the first silicon wafer with the surface of the oxide layer (or SiN) exposed on the front surface of the third silicon wafer, aligning and bonding the surfaces of the second photodiodes exposed on the front surface of the second silicon wafer with the surfaces of the first photodiodes exposed on the back surface of the first silicon wafer, aligning and bonding the surface of the second isolation layer exposed on the front surface of the second silicon wafer with the surface of the first isolation layer exposed on the back surface of the first silicon wafer, and aligning and bonding other surfaces exposed of the bulk silicon wafer on the front surface of the second silicon wafer with other surfaces exposed of the bulk silicon wafer on the front surface of the first silicon wafer.

The bonding process between the first silicon wafer and the second silicon wafer can be performed by a through-silicon vias (TSV) bonding or a hybrid bonding (hybrid-bonding).

Figure 8:
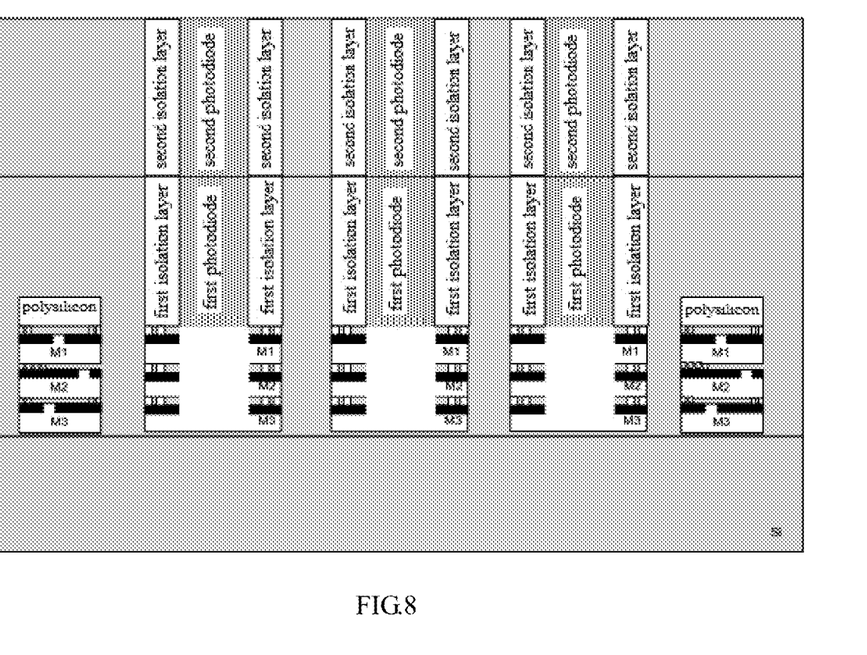

Please refer to FIG. 8. Step S08: performing a thinning process on the bonded silicon wafer, that is, performing the thinning process on the back surface of the second silicon wafer (corresponding to the direction of the upper surface of the second silicon wafer in FIG. 1, same applied below), for example, performing a CMP process, polishing to a depth to reach the second photodiodes and removing the second isolation layer at the bottom of the second photodiodes (the upper side in FIG. 8) completely, so as to expose the bottom of the first photodiode completely, and near-infrared lights incident from above can penetrate from the second photodiodes to the first photodiodes.

Step S09: then, forming through silicon vias (TSV) in the second silicon wafer and the first silicon wafer, and metal filling of the through silicon vias is performed, so as to connect the lower ends of the TSVs with the poly-silicon (POLY) gate structure of the control transistor on the first silicon wafer, and expose the upper ends of the TSVs to the back surface of the second silicon wafer.

Step S10: finally, a PAD layer is formed on the back surface of the second silicon wafer, the PAD layer is connected to the upper ends of the TSVs, all process steps are completed, and the pixel structure of the stacked image sensor of the present invention are formed as shown in FIG.

Figure 9:
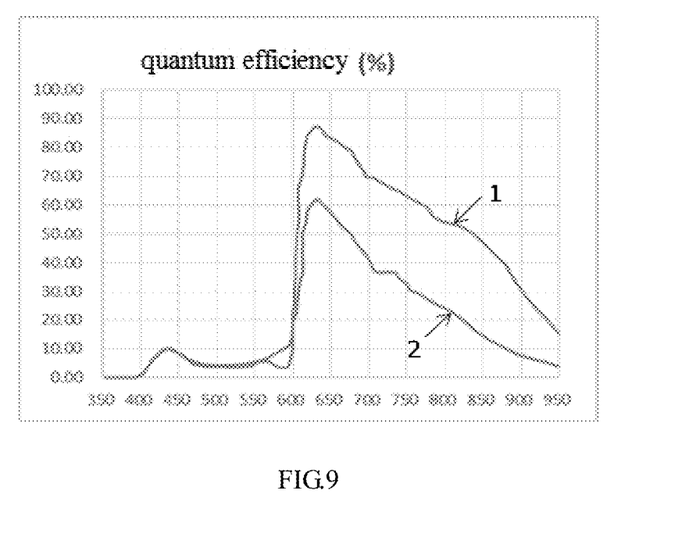
FIG. 9 is a comparison diagram of quantum efficiency.

Please refer to FIG. 9, which shows a comparison graph of quantum efficiency in a R (red) light region between pixel structures of the present invention and the existing image sensor. As shown in FIG. 9, an abscissa is wavelength (nm), and an ordinate is quantum efficiency (%). A curve 1 represents a quantum efficiency response curve of a pixel structure of a stacked image sensor of the present invention, and a curve 2 represents a quantum efficiency response curve of a pixel structure of the existing image sensor. It can be seen from the figure that in red bands, especially near-infrared bands (above 850 nm), the pixel structure of the stacked image sensor proposed by the present invention have better near-infrared response characteristics.

In summary, the present invention adopts the bonding processes to stack the first silicon wafer to the third silicon wafer up and down; wherein, the first photodiode array is provided on the first silicon wafer located in middle, and a second photodiode array is provided on the second silicon wafer located above, and the surface of each the second photodiode in the second photodiode array is aligned and bonded correspondingly with the surface of each the first photodiode in the first photodiode array, so as to form a chip of the pixel structure of the stacked image sensor with a very deep junction depth, which is particularly suitable for near-infrared sensitization, and can effectively improve quantum efficiency in near-infrared wave bands; and by adopting the backlight technology, incident lights irradiating to photodiodes are not affected by the metal interconnect layers, both of sensitive and fill factor are high, especially for small-size pixels, which has very good photosensitive performance, so as to balance the near-infrared quantum efficiency and the small pixel size.

Other embodiments of the disclosure will be apparent to those skilled in the art from consideration of the specification and practice of the disclosure here. This application is intended to cover any variations, uses, or adaptations of the disclosure following the general principles thereof and including such departures from the disclosure as come within known or customary practice in the art. It is intended that the specification and embodiments be considered as exemplary only, with a true scope and spirit of the disclosure being indicated by the following claims.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A pixel structure of a stacked image sensor, comprising:
a first silicon wafer, which comprises:
   a first photodiode array and control transistors located above;
   a metal interconnect layer located below;
a second silicon wafer, which comprises:
   a second photodiode array;
the second silicon wafer and the first silicon wafer are stacked up and down and bonded; wherein,
both of the first silicon wafer and the second silicon wafer are bulk silicon wafers;
upper surface of each first photodiode in the first photodiode array is exposed and flush with the upper surface of the first silicon wafer, upper and lower surfaces of each second photodiode in the second photodiode array are exposed and flush respectively with the upper and lower surfaces of the second silicon wafer, the upper surface of each the first photodiode is aligned with and bonded to the lower surface of the second photodiode correspondingly, upper surfaces other than the first photodiodes on the first silicon wafer is aligned with and bonded to lower surfaces other than the second photodiodes on the second silicon wafer correspondingly.

2. The pixel structure of claim 1, wherein the first photodiode and the second photodiode are bonded to form a third photodiode, and the junction depth of the third photodiode is greater than photosensitive depth of required near-infrared sensitivity.

3. The pixel structure of claim 1, wherein the sizes of the first photodiode and the second photodiode are 1-9 microns.

4. The pixel structure of claim 1, wherein a first isolation layer is set around each the first photodiode, and the upper surface of the first isolation layer is flush with the upper surface of the first photodiode, a second isolation layer is set around each the second photodiode, the upper and lower surfaces of the second isolation layer are flush respectively with the upper and lower surfaces of the second photodiode, and the upper surface of the first isolation layer is aligned with and bonded to the lower surface of the second isolation layer correspondingly.

5. The pixel structure of claim 1, wherein the metal interconnect layer is one to multiple layers.

6. The pixel structure of claim 1, further comprising TSVs (short for through-silicon via), the TSVs pass through the second silicon wafer which stacked with the first silicon wafer, the upper end of the TSVs are connected to a PAD layer on the upper surface of the second silicon wafer, and the lower end of the TSVs are connected to the control transistors located above on the first silicon wafer.

7. The pixel structure of claim 1, wherein further comprising a third silicon wafer, the lower surface of the first silicon wafer and the upper surface of the third silicon wafer are stacked up and down and bonded together.

8. A preparation method for a pixel structure of a stacked image sensor, comprising:
providing a first silicon wafer, forming a first photodiode array on the front surface of the first silicon wafer, and forming a first isolation layer around and at the bottom of each the first photodiode in the first photodiode array, forming control transistors and a metal interconnect layer above the front surfaces of the first photodiode array and the control transistors;
providing a second silicon wafer, forming a second photodiode array on the front surface of the second silicon wafer, and forming a second isolation layer around and at the bottom of each the second photodiode in the second photodiode array;
flipping the first silicon wafer, and aligning the front surface of the first silicon wafer with a front surface of a third silicon wafer and then performing a bonding process;
thinning the back surface of the first silicon wafer until the first isolation layer at the bottom of the first photodiode is removed completely, so as to expose the bottom of the first photodiodes completely;
aligning the front surface of the second silicon wafer with the back surface of the first silicon wafer and then performing a bonding process;
thinning the back surface of the second silicon wafer until the second isolation layer at the bottom of the second photodiode is removed completely, so as to expose the bottom of the second photodiodes completely;
forming and filling TSVs in both the second silicon wafer and the first silicon wafer, connecting the lower ends of the TSVs with the control transistors on the first silicon wafer, and exposing the upper ends of the TSVs on the back surface of the second silicon wafer;
forming a PAD layer on the back surface of the second silicon wafer, connecting the PAD layer with the upper ends of the TSVs.

9. The method of claim 8, wherein aligning the front surface of the second silicon wafer with the back surface of the first silicon wafer and then performing a bonding process, comprising: the surfaces of the second photodiodes on the front surface of the second silicon wafer are aligned with the surfaces of the first photodiodes exposed on the back surface of the first silicon wafer, and the surface of the second isolation layer exposed on the front surface of the second silicon wafer is aligned with the surface of the first isolation layer exposed on the back surface of the first silicon wafer, and then bonding together.

10. The method of claim 8, wherein the bonding processes are performed by a TSV bonding or a hybrid bonding.

* * * * *